(12) United States Patent
You

(10) Patent No.: US 8,796,768 B2
(45) Date of Patent: Aug. 5, 2014

(54) ORGANIC LIGHT EMITTING DISPLAY DEVICE INCLUDING NANO SILVER PARTICLES AND METHOD OF MANUFACTURING THE SAME

(75) Inventor: Chun-Gi You, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 32 days.

(21) Appl. No.: 13/309,235

(22) Filed: Dec. 1, 2011

(65) Prior Publication Data
US 2013/0015456 A1 Jan. 17, 2013

(30) Foreign Application Priority Data

Jul. 15, 2011 (KR) .................. 10-2011-0070661

(51) Int. Cl.
*H01L 27/12* (2006.01)
(52) U.S. Cl.
USPC ............ 257/347; 257/E27.112; 257/E29.117; 257/E21.412; 438/149
(58) Field of Classification Search
CPC .................. H01L 21/02601; H01L 31/03845; H01L 2251/5369; H01L 27/1214; H01L 27/3248
USPC ........... 257/347, E27.112, E29.117, E21.412; 438/149
See application file for complete search history.

(56) References Cited

U.S. PATENT DOCUMENTS

| | | | | |
|---|---|---|---|---|
| 7,696,518 B2 * | 4/2010 | Koo | | 257/72 |
| 7,919,015 B2 | 4/2011 | Li et al. | | |
| 2006/0202202 A1 * | 9/2006 | Denda et al. | | 257/59 |
| 2007/0247556 A1 * | 10/2007 | Jang et al. | | 349/38 |
| 2008/0157064 A1 * | 7/2008 | Tsai et al. | | 257/40 |
| 2010/0133539 A1 * | 6/2010 | Kang et al. | | 257/59 |

FOREIGN PATENT DOCUMENTS

| | | |
|---|---|---|
| JP | 2006-261528 | 9/2006 |
| JP | 2007-280986 | 10/2007 |
| JP | 2008-95194 | 4/2008 |
| JP | 2009-105083 | 5/2009 |

* cited by examiner

*Primary Examiner* — Tom Thomas
*Assistant Examiner* — Christopher M Roland
(74) *Attorney, Agent, or Firm* — Robert E. Bushnell, Esq.

(57) ABSTRACT

In an organic light-emitting display device and a method of manufacturing the same, the display device may include: a thin-film transistor including an active layer, a gate electrode including a first electrode which includes nano-Ag on an insulating layer formed on the active layer and a second electrode on the first electrode, a source electrode, and a drain electrode; an organic light-emitting device including a pixel electrode electrically connected to the thin-film transistor and formed of the same layer as, and using the same material used to form, the first electrode, an intermediate layer including an emissive layer, and an opposite electrode covering the intermediate layer and facing the pixel electrode; and a pad electrode formed of the same layer as, and using the same material used to form, the first electrode in a pad area located outside of a light-emitting area.

20 Claims, 14 Drawing Sheets

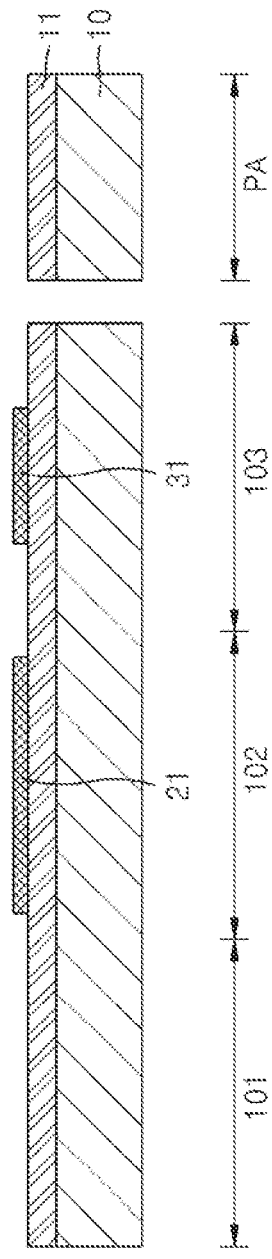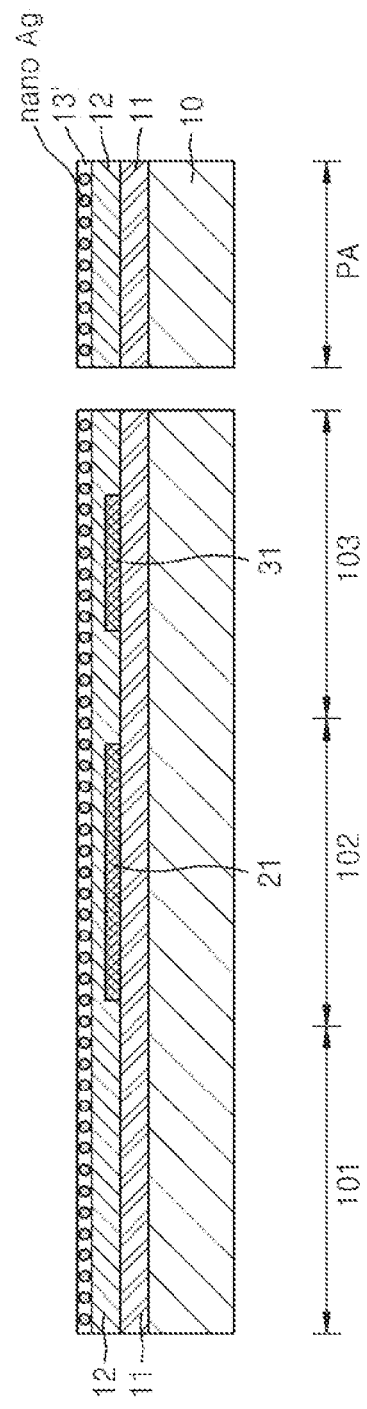

FIG. 15
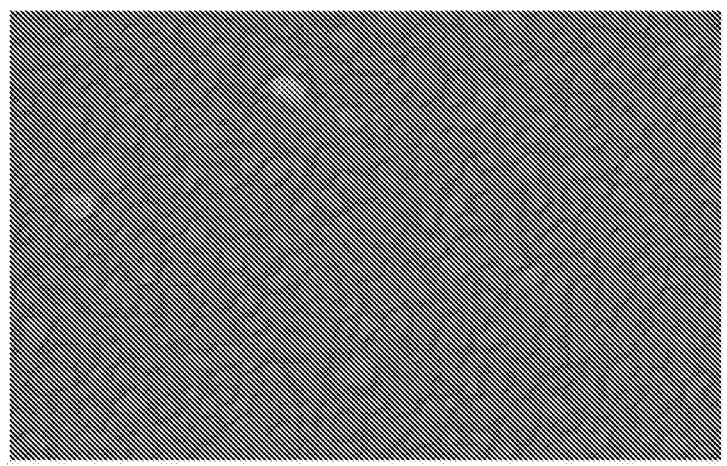
(a)
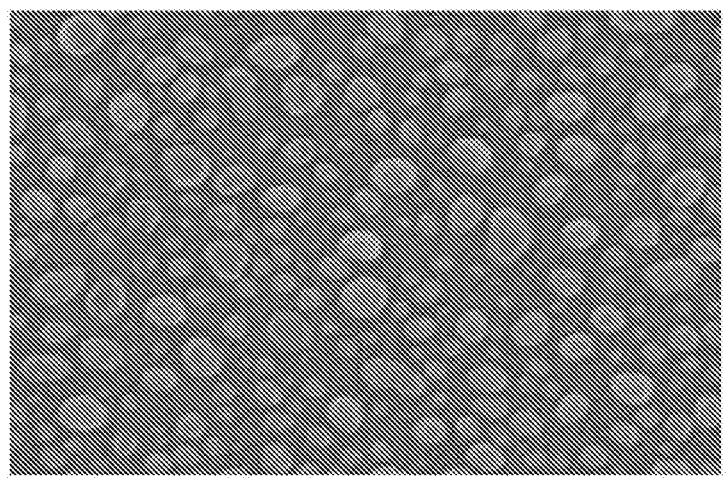
(b)

ORGANIC LIGHT EMITTING DISPLAY DEVICE INCLUDING NANO SILVER PARTICLES AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on the 15 Jul. 2011 and there duly assigned Serial No. 10-2011-0070661.

BACKGROUND OF THE INVENTION

1. Field of the Invention

The present invention relates to an organic light emitting display device and a method of manufacturing the same, and more particularly, to an organic light emitting display device in which a manufacturing process is simplified, and damage to a pad electrode is minimized, and a method of manufacturing the same.

2. Description of the Related Art

Flat panel display devices, such as an organic light emitting display device and a liquid crystal display device, are manufactured on a substrate in which a pattern including a thin-film transistor (TFT), a capacitor, and a wiring connecting the thin-film transistor TFT and the capacitor is formed.

Generally, in order to form a pattern having a fine structure including a TFT on a substrate on which a flat panel display device is manufactured, the pattern is transferred onto the substrate by using a mask having the pattern of the fine structure.

A photo-lithography process is generally used to transfer a pattern by using a mask. In the photolithography process, a photoresist is uniformly coated on a substrate in which a pattern is to be formed, the photoresist is exposed by using exposure equipment such as a stepper, and then, in the case of a positive photoresist, the exposed photoresist is developed. Also, after developing the photoresist, a series of processes for etching the pattern by using the remaining photoresist as a mask and removing unnecessary photoresist are performed.

The process of transferring the pattern by using the mask needs a mask, including a necessary pattern, in advance. Thus, as the number of processes which use masks increases, manufacturing cost for preparing the masks increase. In addition, the above-described complicated steps involve complex manufacturing processes which increases manufacturing time and, accordingly, increases manufacturing cost.

SUMMARY OF THE INVENTION

The present invention provides an organic light-emitting display device in which patterning processes are reduced, and excellent display quality is achieved, and a method of manufacturing the same.

According to an aspect of the present invention, there is provided an organic light-emitting display device which may include: a thin-film transistor which includes an active layer, a gate electrode which includes a first electrode which includes nano-Ag on an insulating layer formed on the active layer and a second electrode on the first electrode, a source electrode, and a drain electrode; an organic light-emitting device which includes a pixel electrode which is electrically connected to the thin-film transistor and is formed of the same layer as the first electrode using the same material used to form the first electrode, an intermediate layer which includes an emissive layer, and an opposite electrode which covers the intermediate layer and faces the pixel electrode; and a pad electrode formed of the same layer as the first electrode using the same material used to form the first electrode in a pad area located outside of a light-emitting area.

The organic light-emitting display device may further include a capacitor which includes a lower electrode which includes a semiconductor material which is flush with the active layer and is doped with a dopant and an upper electrode which is formed of the same layer as the first electrode using the same material used to form the first electrode.

The first electrode of the thin-film transistor, the pixel electrode of the organic light-emitting device, and the pad electrode may be conductive layers formed of a transparent conductive material which includes nano-Ag, or may include a nano-Ag thin-film which includes nano-Ag and a conductive layer formed of a transparent conductive material formed on the nano-Ag thin-film.

The second electrode may be formed as a multiple layer.

The pixel electrode may be electrically connected to one of the source electrode and the drain electrode through an electrode layer formed of the same layer as the second electrode using the same material used to form the second electrode.

The pad electrode may be electrically connected to a driver IC which supplies a current for driving the organic light-emitting display device.

According to an aspect of the present invention, there is provided a method of manufacturing an organic light-emitting display device, and the method may include: performing a first mask process for forming an active layer of a thin-film transistor and a lower electrode of a capacitor; forming a first insulating layer and a nano-Ag thin-film on the active layer and the lower electrode; performing a second mask process for respectively forming a gate electrode of the thin-film transistor, a first electrode pattern for forming a pixel electrode, a second electrode pattern for forming the upper electrode of the capacitor, and a third electrode pattern for forming a pad electrode in a pad area on the first insulating layer; performing a third mask process for forming an interlayer insulating layer having openings which expose both edges of the active layer, the first electrode pattern, the second electrode pattern, and the third electrode pattern; performing a fourth mask process for respectively forming the source and the drain electrodes which contact both edges of the active layer, the pixel electrode, the upper electrode of the capacitor, and the pad electrode; and performing a fifth mask process for forming a pixel defining film which exposes the pixel electrode.

The performing of the first mask process may include: forming a semiconductor layer on a substrate; and forming the active layer and the lower electrode of the capacitor by patterning the semiconductor layer.

The forming of the nano-Ag thin-film may include: forming a first insulating layer on the active layer and the lower electrode; forming an Ag thin-film on the first insulating layer; and forming the nano-Ag thin-film by annealing the Ag thin-film.

The performing of the second mask process may include: sequentially forming a first conductive layer and a second conductive layer on the nano-Ag thin-film; forming a gate electrode which uses the nano-Ag thin-film and the first conductive layer as a first electrode and the second conductive layer as a second electrode by patterning the nano-Ag thin-film, the first conductive layer, and the second conductive layer; and respectively forming a first electrode pattern for forming the pixel electrode, a second electrode pattern for forming the upper electrode of the capacitor, and a third electrode pattern for forming the pad electrode.

The method may further include doping both edges of the active layer after performing the second mask process.

The first conductive layer may be a conductive layer formed of a transparent conductive material and the first conductive layer may fill pores of the nano-Ag thin-film.

The second conductive layer may be formed as a multiple layer.

The performing of the third mask process may include: forming a second insulating layer on the substrate on which the gate electrode, the first electrode pattern, the second electrode pattern, and the third electrode pattern are formed; and forming openings which expose both edges of the active layer by patterning the second insulating layer and the first insulating layer and openings which expose the first electrode pattern, the second electrode pattern, and the third electrode pattern by patterning the second insulating layer.

The performing of the fourth mask process may include: forming a third conductive layer on the interlayer insulating layer; forming the source electrode and the drain electrode by patterning the third conductive layer; and respectively forming the pixel electrode which uses the first conductive layer and the nano-Ag thin-film as an electrode, the upper electrode of the capacitor, and the pad electrode by removing at least a portion of the second conductive layer which constitutes the first electrode pattern, the second electrode pattern, and the third electrode pattern together with the forming of the source electrode and the drain electrode.

The method may further include doping the lower electrode of the capacitor after performing the fourth mask process.

The performing of the fifth mask process may include: forming a third insulating layer on an entire surface of a substrate; and forming a pixel defining layer by patterning the third insulating layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIGS. 3 through 14 are schematic cross-sectional views showing a method of manufacturing the organic light-emitting display device of FIG. 2; and FIG. 15 shows the formation of nano-Ag according to an embodiment of the present invention.

DETAILED DESCRIPTION OF THE INVENTION

Figure 1:
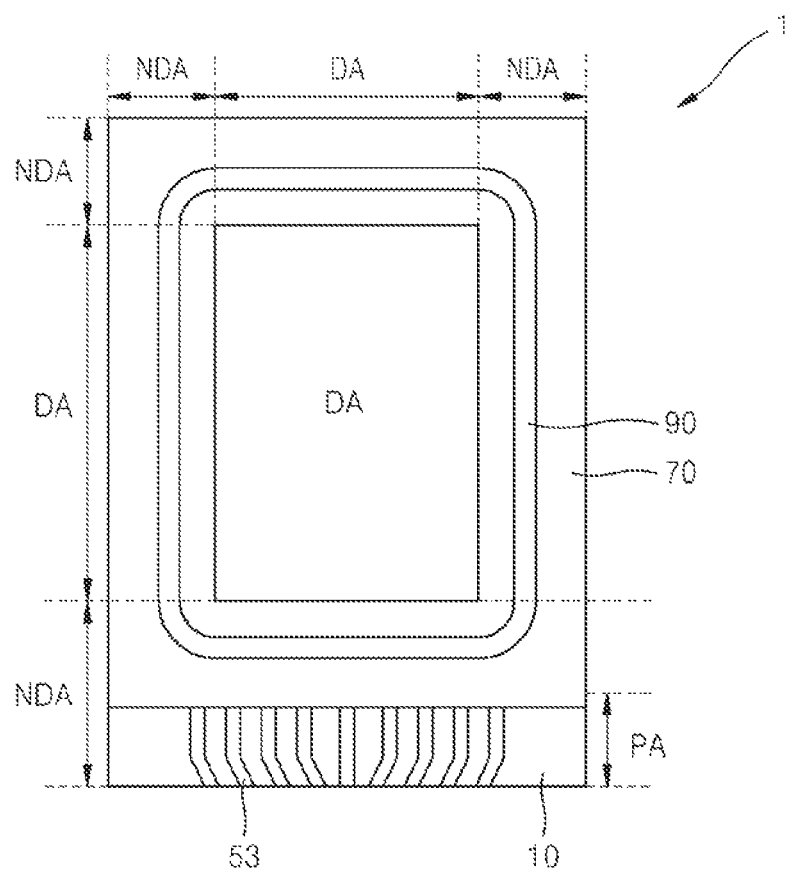
FIG. 1 is a schematic plan view of the structure of an organic light-emitting display device according to an embodiment of the present invention.

The present invention will be described more fully with reference to the accompanying drawings, in which exemplary embodiments of the present invention are shown.

In the drawings, like reference numerals denote like elements. In describing the present invention, when practical descriptions with respect to related known function and configuration may unnecessarily make the scope of the present invention unclear, the descriptions thereof will be omitted.

In describing drawings for explaining an embodiment of the current invention, the thicknesses of layers and regions are exaggerated for clarity. It will be understood that, when an element or layer is referred to as being "on" another element or layer, the element or layer may be directly on another element or layer or intervening elements or layers.

FIG. 1 is a schematic plan view of the structure of an organic light-emitting display device according to an embodiment of the present invention.

The organic light-emitting display device 1 may include a first substrate 10 which includes a thin-film transistor TFT and an organic light-emitting device EL, and a second substrate 70 which is combined with the first substrate 10 through a sealing member.

The first substrate 10 may include the thin-film transistor TFT, the organic light-emitting device EL, and a capacitor Cst. Also, the first substrate 10 may be a crystalline substrate (LTPS), a glass substrate, or a plastic substrate.

The second substrate 70 may be a sealing substrate disposed on the first substrate 10 to prevent external moisture and air from penetrating into the thin-film transistor TFT and light-emitting pixels included on the first substrate 10. The second substrate 70 is disposed to face the first substrate 10, and the first substrate 10 and the second substrate 70 are combined with each other by a sealing member 90 disposed along edges of the first substrate 10 and the second substrate 70. The second substrate 70 may be a glass substrate, a plastic substrate, or a stainless using steel (SUS) substrate.

The first substrate 10 may include a light-emitting area DA and a non-light-emitting area NDA disposed in an edge-side of the light-emitting area DA. According to an embodiment of the present invention, the first substrate 10 and the second substrate 70 are combined by the sealing member 90 disposed in the non-light-emitting area NDA disposed in an edge-side of the light-emitting area DA.

As described above, the organic light-emitting device EL, the thin-film transistor TFT for driving the organic light-emitting device EL, a capacitor Cst, and wirings for electrically connecting the organic light-emitting device EL, the thin-film transistor TFT, and the capacitor Cst are formed in the light-emitting area DA of the first substrate 10. A pad area PA on which pad electrodes 53 formed by extending from the wirings disposed in the light-emitting area DA may be included in the non-light-emitting area NDA.

Figure 2:
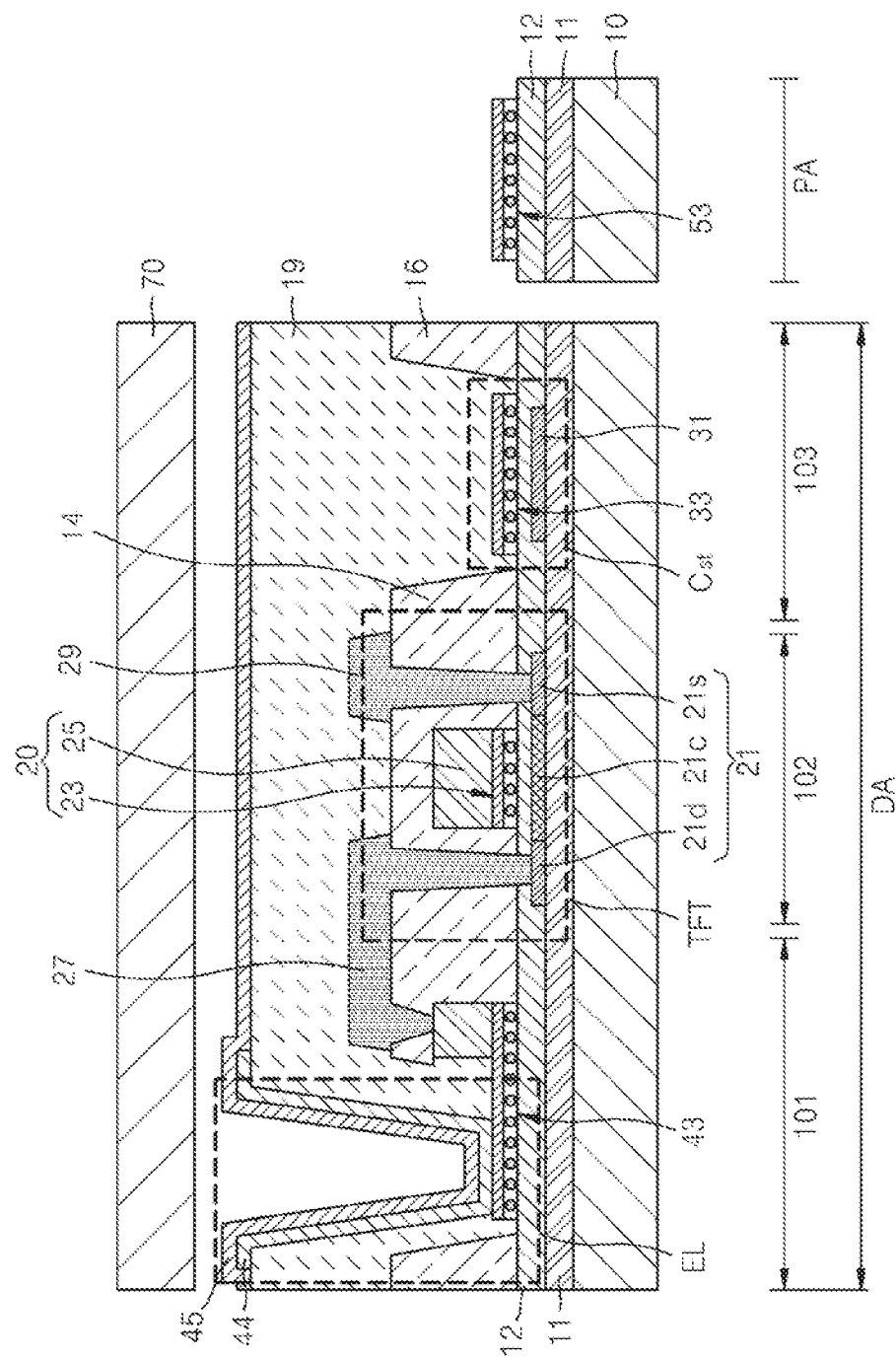
FIG. 2 is a cross-sectional view of a light-emitting area and a pad area which is a non-light-emitting area of the organic light-emitting display device of FIG. 1.

FIG. 2 is a cross-sectional view of a light-emitting area and a pad area which is a non-light-emitting area of the organic light-emitting display device of FIG. 1. More specifically, FIG. 2 is a cross-section view of the light-emitting area DA and the pad area PA which is the non-light-emitting area NDA of the organic light-emitting display device 1 of FIG. 1.

Referring to FIG. 2, the organic light-emitting display device 1 may include a pixel area 101, a channel area 102, a storage area 103, and the pad area PA which are formed on the first substrate 10.

The organic light-emitting device EL is included in the pixel area 101. The organic light-emitting device EL includes a pixel electrode 43 which is connected to one of a source electrode 29 and a drain electrode 27 of the thin-film transistor TFT, an opposite electrode 45 facing the pixel electrode 43, and an intermediate layer 44 interposed between the pixel electrode 43 and the opposite electrode 45. The pixel electrode 43 is formed of a transparent conductive material, and may include silver (Ag) having a nano-size particle type. In FIG. 2, the pixel electrode 43 has a double layer structure in which a nano-Ag thin-film and a conductive layer formed of a transparent conductive material are formed. However, the pixel electrode 43 may have a single layer structure in which the conductive layer formed of a transparent conductive material fills pores of the nano-Ag thin-film. The pixel electrode 43 may be formed of the same layer as a first electrode 23 of the thin-film transistor TFT and an upper electrode 33 of the capacitor Cst using the same material used to form the first electrode 23 of the thin-film transistor TFT and the upper electrode 33 of the capacitor Cst.

The channel area 102 includes the thin-film transistor TFT as a driving device. The thin-film transistor TFT includes an active layer 21, a gate electrode 20, the source electrode 29, and the drain electrode 27. The gate electrode 20 includes the first electrode 23 and a second electrode 25 formed on the first electrode 23. At this point, the first electrode 23 is formed of a transparent conductive material and may include silver (Ag) having a nano-sized particle type. In FIG. 2, the first electrode 23 has a double layer structure in which a nano-Ag thin film and a conductive layer formed of a transparent conductive material are formed. However, the first electrode 23 may have a single layer structure in which the conductive layer formed of a transparent conductive material fills pores of the nano-Ag thin-film. A first insulating layer 12, which is a gate insulating layer for insulating the gate electrode 20 from the active layer 21, is interposed between the gate electrode 20 and the active layer 21. Also, source and drain areas 21s and 21d, respectively, which are highly doped with a dopant, are formed on both edges of the active layer 21, and the source and drain areas 21s and 21d, respectively, are connected to the source electrode 29 and the drain electrode 27, respectively.

The storage area 103 includes the capacitor Cst. The capacitor Cst includes a lower electrode 31 and the upper electrode 33, and the first insulating layer 12 is interposed between the lower electrode 31 and the upper electrode 33. Here, the lower electrode 31 may be flush with the active layer 21 of the thin-film transistor TFT. The lower electrode 31 is formed of a semiconductor material, and the electrical conductivity of the lower electrode 31 is increased by doping the lower electrode 31 with a dopant. The upper electrode 33 may be formed of the same layer as the first electrode 23 of the thin-film transistor TFT, the pixel electrode 43 of the organic light-emitting device EL, and a pad electrode 53 of the pad area PA using the same material used to form the first electrode 23 of the thin-film transistor TFT, the pixel electrode 43 of the organic light-emitting device EL, and the pad electrode 53 of the pad area PA. That is, the upper electrode 33 may have a double layer structure in which a nano-Ag thin-film and a conductive layer formed of a transparent conductive material are formed, or a single layer structure in which the conductive layer formed of a transparent conductive material fills pores of the nano-Ag thin-film.

The pad area PA includes the pad electrode 53. At this point, the pad electrode 53 may be formed of the same layer as the first electrode 23 of the thin-film transistor TFT, the upper electrode 33 of the capacitor Cst, and the pixel electrode 43 of the organic light-emitting device EL using the same material used to form the first electrode 23 of the thin-film transistor TFT, the upper electrode 33 of the capacitor Cst, and the pixel electrode 43 of the organic light-emitting device EL. That is, the pad electrode 53 may have a double layer structure in which a nano-Ag thin-film and a conductive layer formed of a transparent conductive material are formed, or a single layer structure in which the conductive layer formed of a transparent conductive material fills pores of the nano-Ag thin-film. The pad electrode 53 is electrically connected to a driver IC (not shown) which supplies a current for driving the organic light-emitting display device 1. Thus, the pad electrode 53 transmits a current from the driver IC to the light-emitting area DA.

FIGS. 3 through 14 are schematic cross-sectional views showing a method of manufacturing the organic light-emitting display device of FIG. 2. Hereinafter, a manufacturing process of the organic light-emitting display device 1 depicted in FIG. 2 will be described.

Referring to FIG. 3, first, an auxiliary layer 11 is formed on the first substrate 10. The first substrate 10 may be formed of a transparent glass material having $SiO_2$ as a main component. The material for forming the first substrate 10 is not limited thereto, that is, the first substrate 10 may be formed of various materials, such as a transparent plastic material or a metal.

The auxiliary layer 11, such as a barrier layer, a blocking layer and/or a buffer layer for preventing diffusion of impurity ions and penetration of moisture and air, and for planarizing a surface of the first substrate 10, may be formed on an upper surface of the first substrate 10. The auxiliary layer 11 may be formed by various deposition methods, such as a plasma enhanced chemical vapor deposition (PECVD) method, an atmospheric pressure CVD (APCVD) method, or a low pressure CVD (LPCVD) method using $SiO_2$ and/or $SiN_x$.

The active layer 21 of the thin-film transistor TFT and the lower electrode 31 of the capacitor Cst are formed on the auxiliary layer 11. More specifically, a polycrystalline silicon layer (not shown) is formed by crystallizing an amorphous silicon layer (not shown) after depositing the amorphous silicon layer (not shown) on the auxiliary layer 11. The amorphous silicon layer (not shown) may be crystallized by various crystallization methods, for example, a rapid thermal annealing (RTA) method, a solid phase crystallization (SPC) method, an excimer laser annealing (ELA) method, a metal induced crystallization (MIC) method, a metal induced lateral crystallization (MILC) method, or a sequential lateral solidification (SLS) method. The polycrystalline silicon layer is patterned to the active layer 21 of the thin-film transistor TFT and the lower electrode 31 of the capacitor Cst by a mask process which uses a first mask (not shown).

In the current embodiment, the active layer 21 of the thin-film transistor TFT and the lower electrode 31 of the capacitor Cst are separated. However, the active layer 21 of the thin-film transistor TFT and the lower electrode 31 of the capacitor Cst may be formed as one body.

Next, as depicted in FIG. 4, the first insulating layer 12 and a nano-Ag thin-film 13' are deposited on the entire surface of the first substrate 10 on which the active layer 21 of the thin-film transistor TFT and the lower electrode 31 of the capacitor Cst are formed.

The first insulating layer 12 may be an inorganic insulating film deposited by a PECVD method, an APCVD method, or a LPCVD method using $SiN_x$ or $SiO_x$. The first insulating layer 12 functions as a gate insulating layer of the thin-film transistor TFT by being disposed between the active layer 21 and the gate electrode 20 (see FIG. 2) of the thin-film transistor TFT, and functions as a dielectric layer of the capacitor Cst by being disposed between the upper electrode 33 (see FIG. 2) and the lower electrode 31 of the capacitor Cst.

In order to realize a metal minor, a metal having self-contradictory characteristics of low absorption rate and high reflectance is required. Silver (Ag) is a metal which well satisfies these requirements.

After depositing an Ag thin-film on the first insulating layer 12 by sputtering, when a physical and/or thermal change is applied to the Ag thin-film, for example, annealing at 200° C., as depicted in FIG. 15(*a*), an Ag agglomeration phenomenon may occur in the Ag thin-film. Accordingly, as depicted in FIG. 15(*b*), the nano-Ag thin-film 13', in which pores are formed between Ag particles having a nano-size (hereinafter, a nano-Ag), may be formed on the first insulating layer 12. As another example, the nano-Ag thin-film 13' may be formed by directly sputtering the nano-Ag on the first insulating layer 12. The nano-Ag may have different particle sizes according to processes, and may have non-uniform particle sizes. The nano-Ag thin-film 13' may have a thickness of approximately less than 100 Å.

Figure 5:
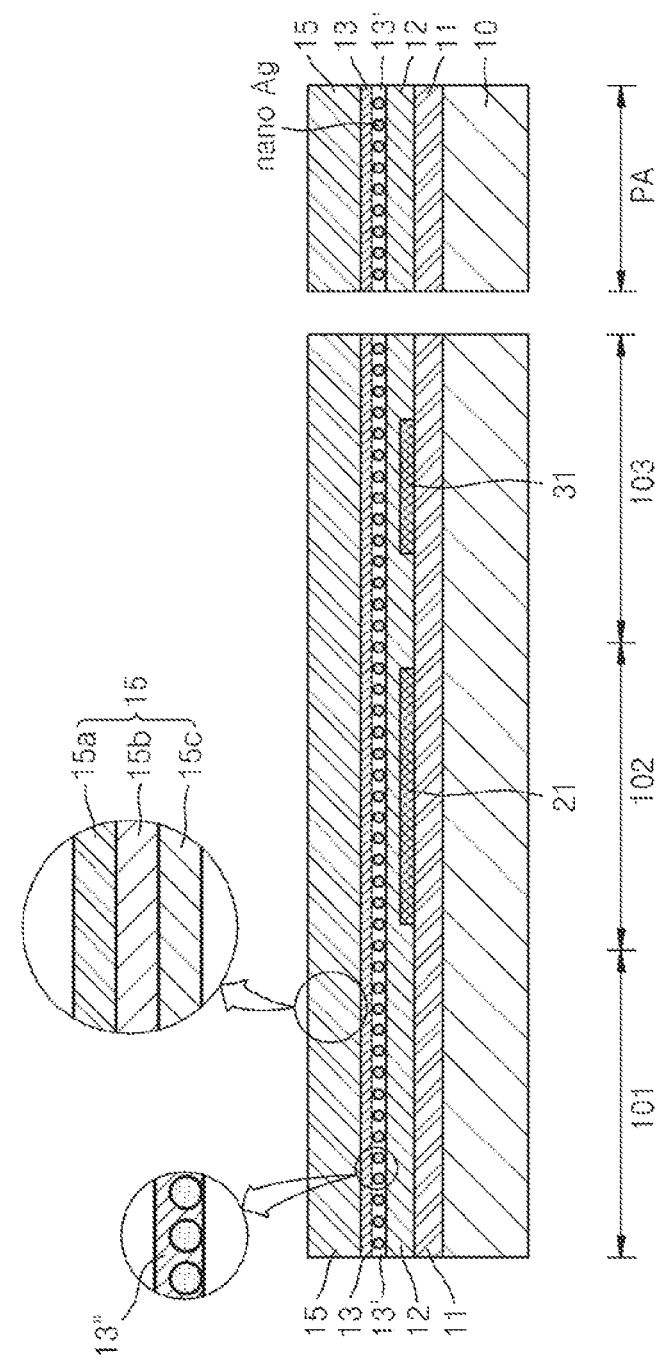

Next, as depicted in FIG. 5, a first conductive layer 13 and a second conductive layer 15 are sequentially deposited on the entire surface of the first substrate 10 on which the first insulating layer 12 and the nano-Ag thin-film 13' are formed.

The first conductive layer 13 is a transparent conductive layer, and may include at least one selected from the group consisting of indium tin oxide (ITO), indium zinc oxide (IZO), zinc oxide (ZnO), indium oxide (In203), indium gallium oxide (IGO), and aluminum zinc oxide (AZO).

In the current embodiment, a double layer structure in which the first conductive layer 13 is formed on the nano-Ag thin-film 13' is depicted. However, as separately depicted in FIG. 5, a single layer structure of a first nano conductive layer 13", in which the first conductive layer 13 fills pores of the nano-Ag thin-film 13' and includes Ag, may be formed.

The nano-Ag thin-film 13' and the first conductive layer 13 may be patterned to the pixel electrode 43, the first electrode 23 of the gate, the upper electrode 33 of the capacitor Cst, and the pad electrode 53 in a subsequent process.

The second conductive layer 15 may include at least one metal selected from the group consisting of Al, Pt, Pd, Ag, Mg, Au, Ni, Nd, Ir, Cr, Li, Ca, Mo, Ti, W, and Cu.

Also, the second conductive layer 15 may include a plurality of metal layers 15a, 15b, and 15c. In the current embodiment, a structure in which Mo layers 15a and 15c are formed on and under the Al layer 15b, that is, a three layer structure of Mo—Al—Mo, is employed. However, the structure of the second conductive layer 15 is not limited thereto, and the second conductive layer 15 may be formed so as to have various layers by using various materials. The second conductive layer 15 may be patterned to the second electrode 25 of the gate in a subsequent process.

Figure 6:
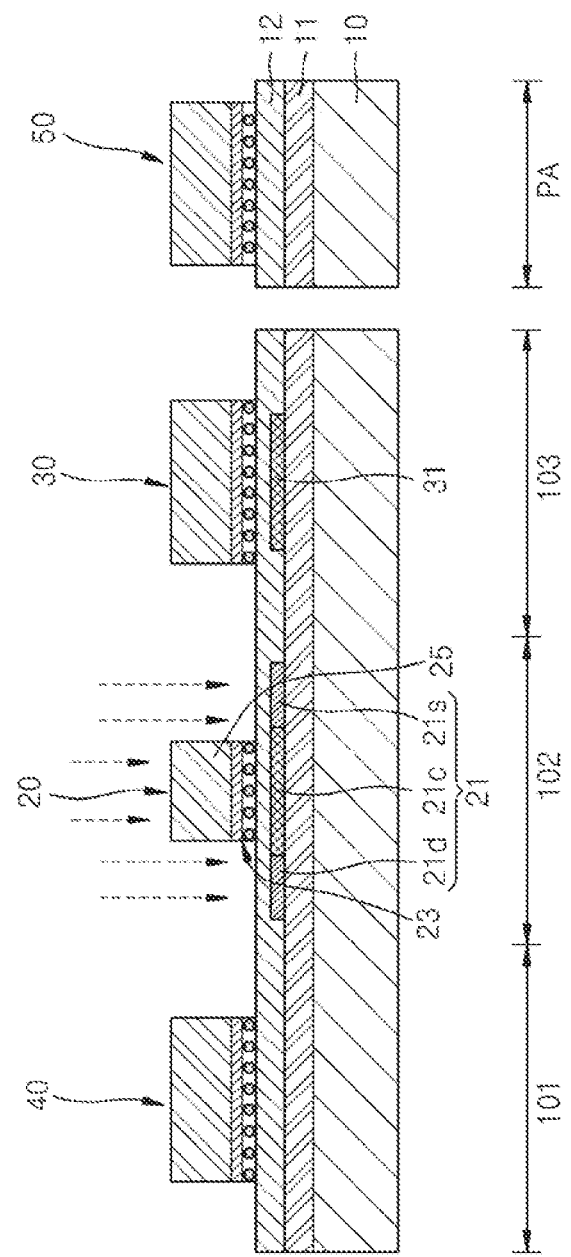

Next, as depicted in FIG. 6, the gate electrode 20, a first electrode pattern 40, a second electrode pattern 30, and a third electrode pattern 50 are respectively formed on the first substrate 10.

The nano-Ag thin-film 13', the first conductive layer 13 and the second conductive layer 15, sequentially stacked on the entire surface of the first substrate 10, are patterned by a mask process which uses a second mask (not shown).

In the channel area 102, the gate electrode 20 is formed above the active layer 21, and the gate electrode 20 includes the first electrode 23 formed of portions of the nano-Ag thin-film 13' and the first conductive layer 13 (see FIG. 5), and the second electrode 25 formed of a portion of the second conductive layer 15 (see FIG. 5).

At this point, the gate electrode 20 is formed so as to correspond to the center of the active layer 21, and the source and drain areas 21s and 21d, respectively, and the channel area 21c between the source and drain areas 21s and 21d, respectively, are formed on both edges of the active layer 21 which correspond to both sides of the gate electrode 20 by doping both edges of the active layer 21 with an n-type or a p-type dopant using the gate electrode 20 as a self align mask. When the active layer 21 is doped with a group III element such as a boron B and a group V element such as nitrogen N, a p-type semiconductor and an n-type semiconductor may be respectively formed. The doping may be performed across the entire surface of the first substrate 10. In the storage area 103, the second electrode pattern 30 for forming the upper electrode 33 of the capacitor Cst in a subsequent process is formed on the lower electrode 31 of the capacitor Cst. In the pixel area 101, the first electrode pattern 40 for forming the pixel electrode 43 in a subsequent process is formed. In the pad area PA, the third electrode pattern 50 for forming the pad electrode 53 in a subsequent process is formed.

Figure 7:
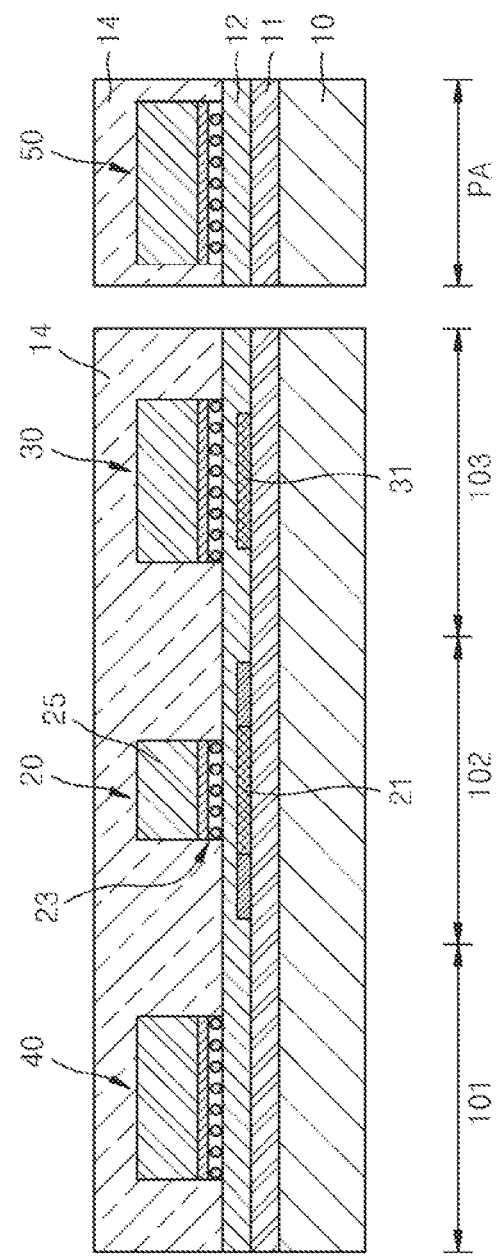

Next, as depicted in FIG. 7, a second insulating layer 14 is deposited on the entire surface of the first substrate 10 on which the gate electrode 20 is formed.

The second insulating layer 14 is formed by a spin coating method using at least one organic insulating material selected from the group consisting of polyimide, polyamide, acryl resin, benzocyclobutene, and phenol resin. The second insulating layer 14 is formed so as to have a thickness sufficient enough, for example, greater than that of the first insulating layer 12, to perform as an interlayer insulating layer between the gate electrode 20 of the thin-film transistor TFT and the source and drain electrodes 29 and 27, respectively. The second insulating layer 14 may also be formed of an inorganic insulating material used to form the first insulating layer 12 in addition to the organic insulating material described above. Also, the second insulating layer 14 may be formed by alternately depositing an organic insulating material and an inorganic insulating material.

Figure 8:
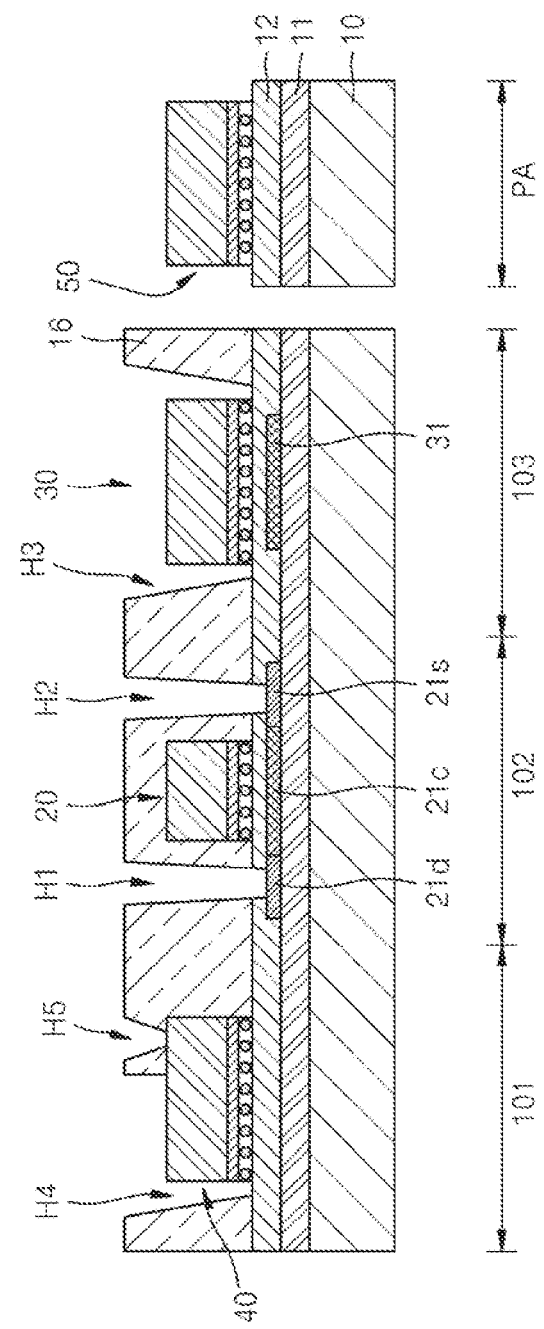

Next, as depicted in FIG. 8, an interlayer insulating layer 16 is formed by patterning the second insulating layer 14. The interlayer insulating layer 16 includes first through fifth openings H1, H2, H3, H4 and H5, respectively, which expose the first through third electrode patterns 30, 40 and 50, respectively, and portions of the source and drain areas 21s and 21d, respectively, of the active layer 21.

More specifically, the first through fifth openings H1, H2, H3, H4 and H5, respectively, are formed by patterning the second insulating layer 14 by a mask process which uses a third mask (not shown). The first and second openings H1 and H2, respectively, expose portions of the source and drain areas 21s and 21d, respectively. The third opening H3 exposes the second conductive layer 15 which constitutes an upper part of the second electrode pattern 30 and at least a portion of the first insulating layer 12 so as to expose the entire second electrode pattern 30. The fourth opening H4 exposes the second conductive layer 15 which constitutes an upper part of the first electrode pattern 40 and at least a portion of the first insulating layer 12, and the fifth opening H5 exposes at least apart of the second conductive layer 15 which constitutes an upper part of the first electrode pattern 40.

The entire third electrode patter 50 is exposed by removing the second insulating layer 14 which covers the third electrode pattern 50 in the pad area PA. At this point, the third electrode pattern 50 may be exposed by forming an opening in the second insulating layer 14 in the pad area PA.

As depicted in FIG. 8, the third opening H3 may be formed so as to expose the entire first electrode pattern 40. However, the present invention is not limited thereto, that is, the third opening H3 may be formed so as to expose at least a portion of the second conductive layer 15 which constitutes an upper part of the first electrode pattern 40.

Figure 9:
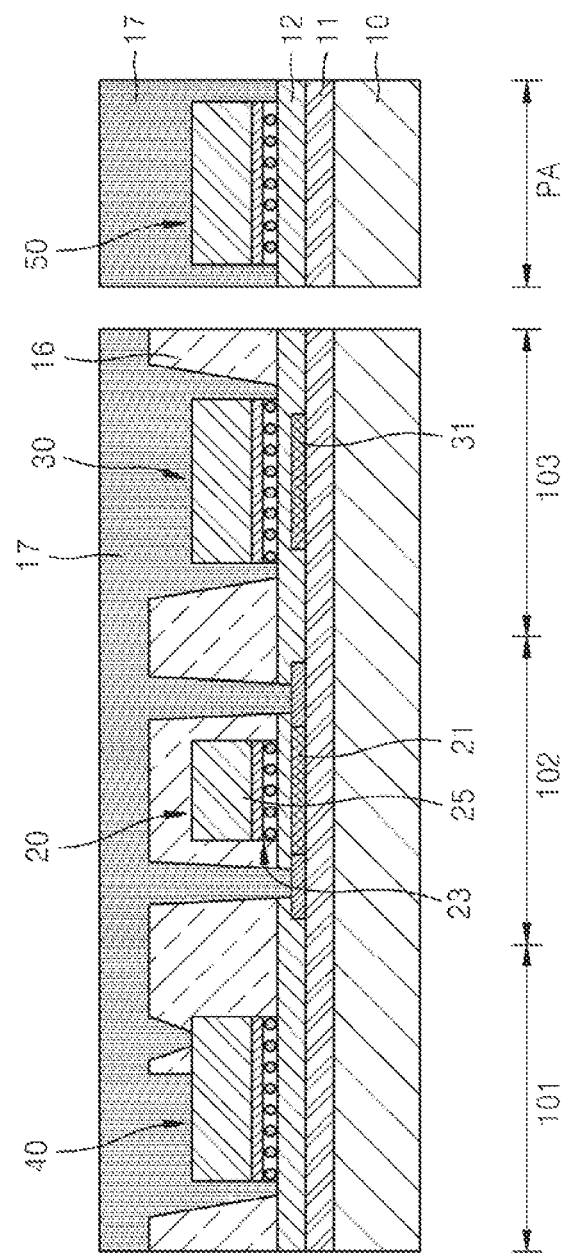

Next, as depicted in FIG. 9, a third conductive layer 17 is formed on the entire surface of the first substrate 10 so as to cover the interlayer insulating layer 16.

The third conductive layer 17 may be formed of the same conductive material used to form the first conductive layer 13 or the second conductive layer 15. However, the current embodiment is not limited thereto, that is, the third conductive layer 17 may be formed of various conductive materials. Also, the conductive material may be deposited so as to have a thickness sufficient enough to fill the first through fifth openings H1, H2, H3, H4 and H5, respectively, and to cover the first through third electrode pattern 40, 30 and 50, respectively.

Figure 10:
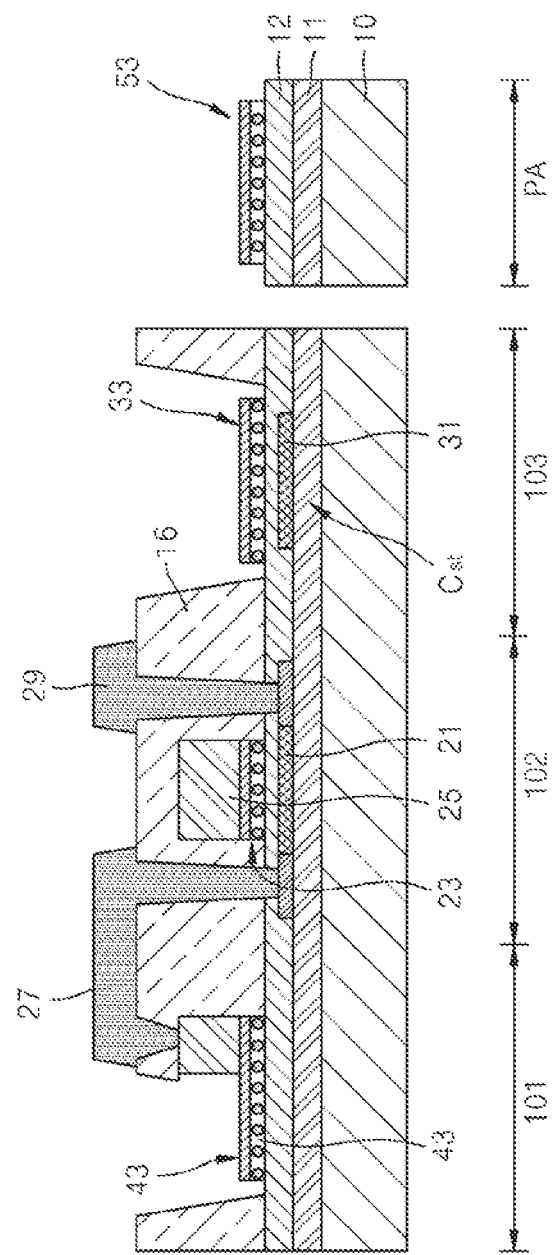

Next, as depicted in FIG. 10, the source electrode 29, the drain electrode 27, pixel electrode 43, the upper electrode 33 of the capacitor Cst, and the pad electrode 53 are respectively formed by etching the third conductive layer 17 of FIG. 9.

After uniformly coating a photoresist material on an entire surface of the third conductive layer 17, the source electrode 29 and the drain electrode 27 are formed by a mask process which uses a fourth mask (not shown). Here, one of the source electrode 29 and the drain electrode 27 (in the current embodiment, the drain electrode 27) is formed so as to contact the pixel electrode 43 through the fifth opening H5 (FIG. 8) formed on an edge area of the second conductive layer 15 (FIG. 5) on the first electrode pattern 40 (FIG. 8) where the pixel electrode 43 (FIG. 10) is formed.

Also, the pixel electrode 43, the upper electrode 33 of the capacitor Cst, and the pad electrode 53 are respectively formed at the same time that the source electrode 29 and the drain electrode 27 are formed. However, the present invention is not limited thereto, that is, the pixel electrode 43, the upper electrode 33 of the capacitor Cst, and the pad electrode 53 may be respectively formed by additional etching after forming the source electrode 29 and the drain electrode 27. More specifically, the pixel electrode 43 is formed by removing the second conductive layer 15 (FIG. 5) of the first electrode pattern 40 (FIGS. 6-9). In addition, the upper electrode 33 of the capacitor Cst is formed by removing the second conductive layer 15 (FIG. 5) of the second conductive pattern 30 (FIGS. 6-9). Furthermore, the pad electrode 53 is formed by removing the second conductive layer 15 (FIG. 5) of the third electrode pattern 50 (FIGS. 6-9). Further referring to FIG. 10, the upper electrode 33 of the capacitor Cst, the pixel electrode 43, and the pad electrode 53 are formed as parts of the nano-Ag thin-film 13' and the first conductive layer 13.

Accordingly, the first electrode 23 of the gate, the upper electrode 33 of the capacitor Cst, the pixel electrode 43, and the pad electrode 53 are formed of the same layer using the same material.

Figure 11:
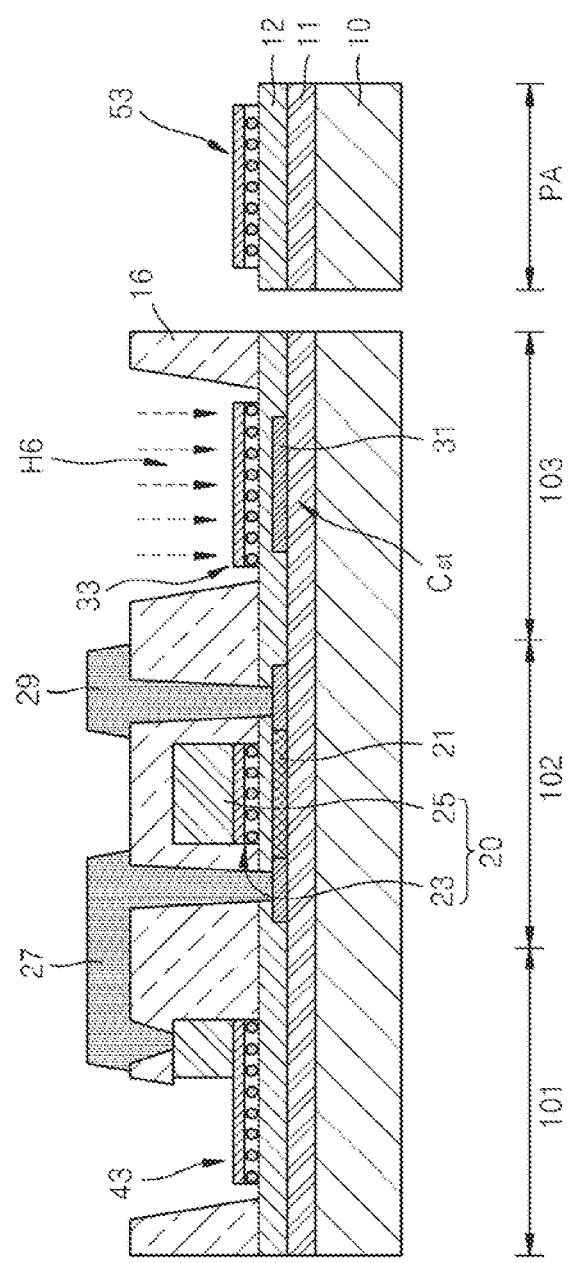

Next, as depicted in FIG. 11, the lower electrode 31 of the capacitor Cst is doped by injecting an n-type or p-type dopant.

At this point, the lower electrode 31 of the capacitor Cst may be doped by injecting an n-type or p-type dopant through a sixth opening H6 created by forming the upper electrode 33 of the capacitor Cst in the storage area 103. The dopant to be injected into the upper electrode 33 of the capacitor Cst may be the same as or different from the dopant used to dope the active layer 21.

Further referring to FIG. 11, the sixth opening H6 is formed wide enough to entirely expose the lower electrode 31 of the capacitor Cst, and the second conductive layer 15 (FIG. 5) of the second electrode pattern 30 (FIG. 6) is completely removed without retaining any portion of the second conductive layer 15 so that the lower electrode 31 (FIG. 11) of the capacitor Cst is completely doped. Therefore, the increase in opening ratio, the increase in capacitance, and the increase in signal transmittance quality of capacitor wiring of the organic light-emitting display device 1 may be achieved. Here, a target of the doping of a dopant is the lower electrode 31 of the capacitor Cst, but the doping may be performed on the entire surface of the first substrate 10.

Figure 12:
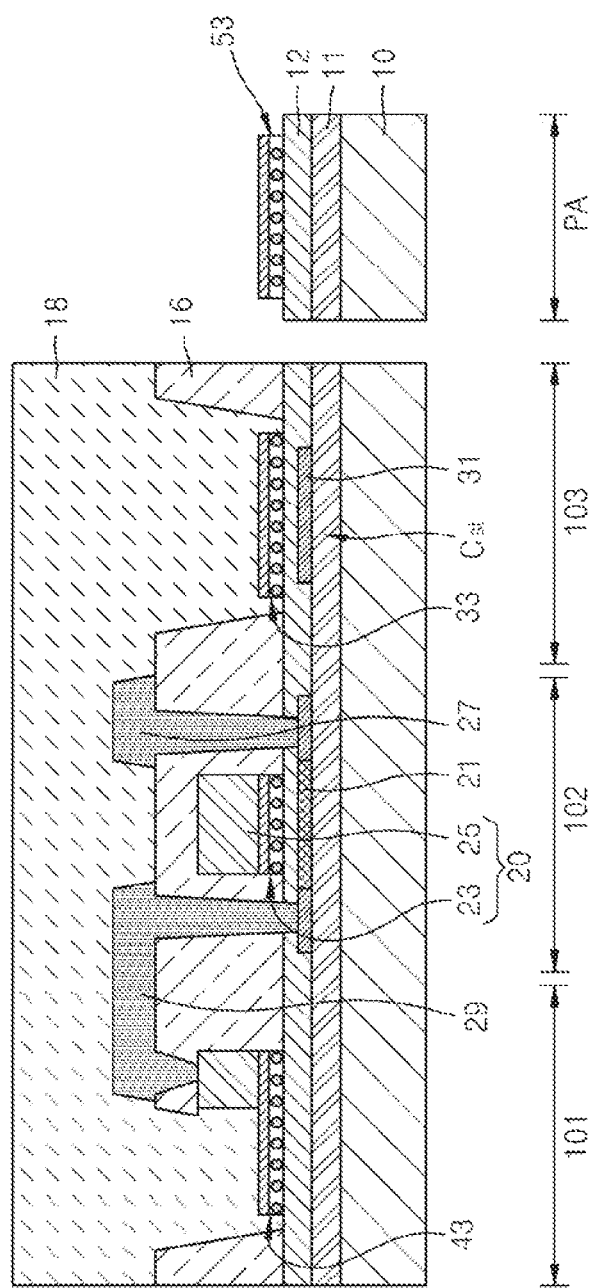

Next, as depicted in FIG. 12, a third insulating layer 18 is formed on the first substrate 10.

More specifically, the third insulating layer 18 is deposited so as to have a thickness sufficient to cover the entire surface of the first substrate 10 on which the pixel electrode 43, the source electrode 29, the drain electrode 27, upper electrode 33 of the capacitor Cst, and the pad electrode 53 are formed. The third insulating layer 18 may be formed by a method such as spin coating using at least one organic insulating material selected from the group consisting of polyimide, polyamide, acryl resin, benzocyclobutene, and phenol resin. Also, the third insulating layer 18 may be formed of an inorganic insulating material selected from the group consisting of $SiO_2$, $SiN_x$, $Al_2O_3$, $CuOx$, $Tb_4O_7$, $Y_2O_3$, $Nb_2O_5$, and $Pr_2O_3$ in addition to the organic insulating material. Also, the third insulating layer 18 may be formed in a multilayer structure in which the organic insulating material and the inorganic insulating material are alternately formed.

However, the third insulating layer 18 may be or may not be optionally deposited in the pad area PA.

The pad area PA is a nano-Ag/ITO pad in which an ITO electrode layer which includes nano-Ag is mounted on the first insulating layer 12.

Figure 13:
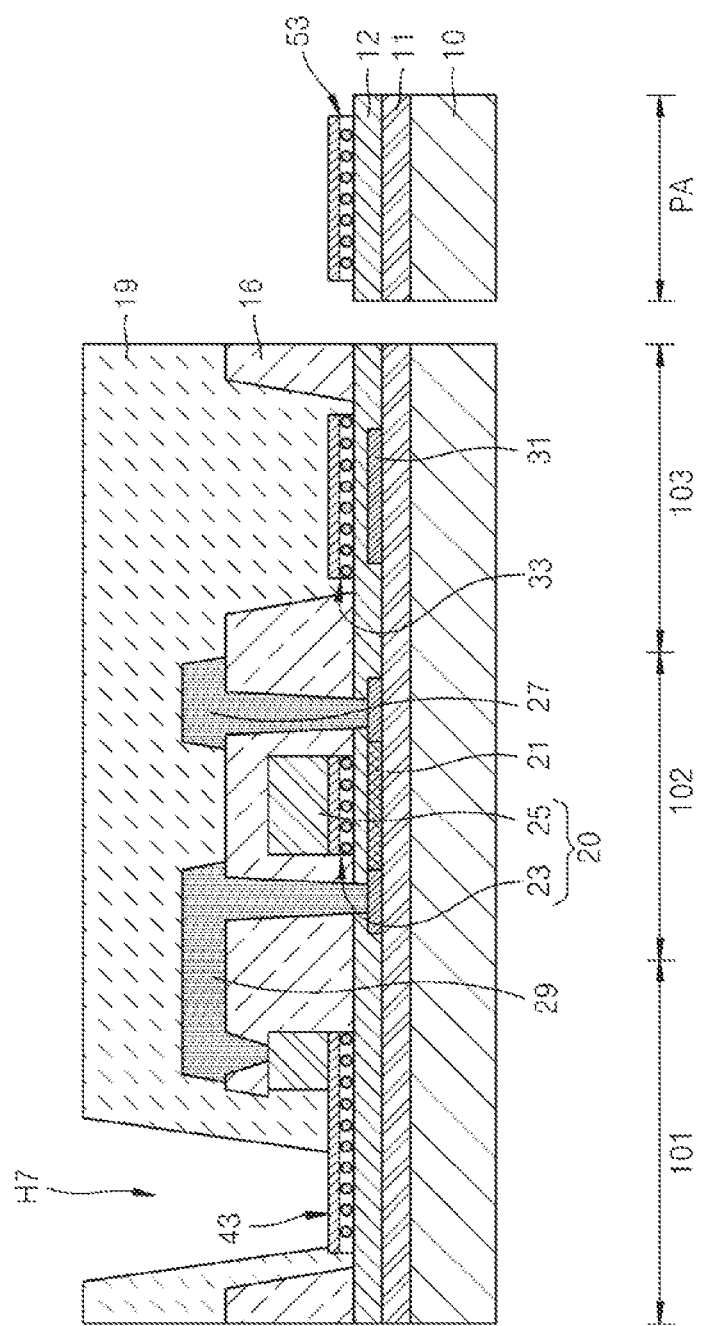

Next, as depicted in FIG. 13, a pixel defining layer 19 is formed by patterning the third insulating layer 18 of FIG. 12.

The pixel defining layer 19 defines a pixel by forming an opening H7 to expose a central portion of the pixel electrode 43 by patterning the pixel defining layer 19 using a mask process which uses a fifth mask (not shown).

Figure 14:
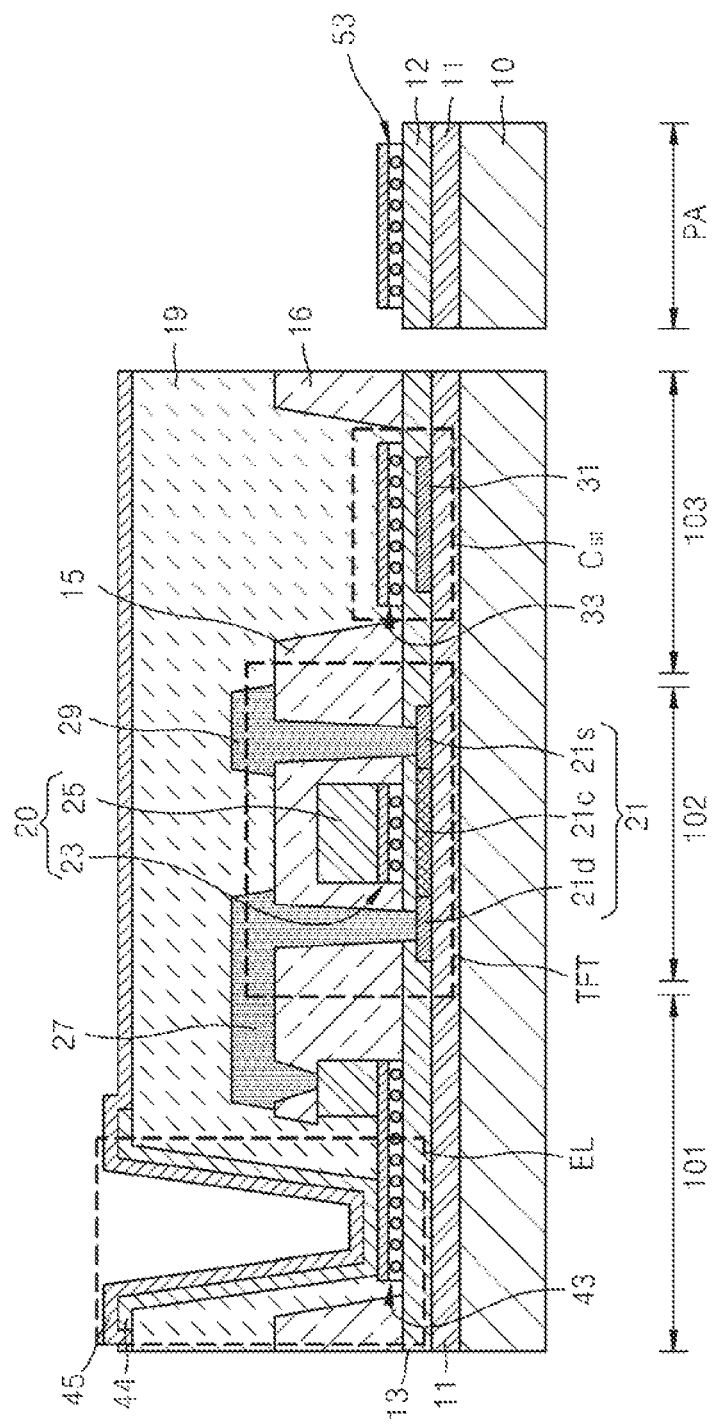

Finally, as depicted in FIG. 14, the intermediate layer 44 which includes a light emitting layer and the opposite electrode 45 are formed in the opening H7 (FIG. 13) which exposes the pixel electrode 43.

The intermediate layer 44 may be formed as a single layer or as a composite layer by stacking an organic emissive layer (EML) and at least one functional layer selected from the group consisting of a hole transport layer (HTL), a hole injection layer (HIL), an electron transport layer (ETL), and an electron injection layer (EIL).

The intermediate layer 44 may be formed of a low molecular weight organic material or a polymer organic material.

When the intermediate layer 44 is formed of a low molecular weight organic material, in the intermediate layer 44, the HTL and the HIL may be stacked in a direction toward the pixel electrode 43 from the organic EML, and the ETL and EIL are stacked in a direction toward the opposite electrode 45 from the EML. Besides the above, various layers may be stacked if necessary. At this point, the intermediate layer 44 may be formed of various low molecular weight organic materials including copper phthalocyanine (CuPc), N,N'-Di(naphthalene-1-yl)-N,N'-diphenyl-benzidine (NPB), or tris-8-hydroxyquinoline aluminum)(Alq3).

When the intermediate layer 44 is formed of a polymer organic material, only the HTL may be included in the intermediate layer 44 in a direction toward the pixel electrode 43 from the EML. The HTL may be formed by an inkjet printing method or a spin coating method using poly-(2,4)-ethylenedihydroxy thiophene (PEDOT) or polyaniline (PANI). At this point, the intermediate layer 44 may be formed of a polymer organic material, such as a poly-phenylenevinylene (PPV) group polymer and a polyfluorene group polymer. A color pattern of the intermediate layer 44 may be formed by using a conventional method such as an inkjet printing method, a spin coating method, or a thermal transfer method which uses a laser.

The opposite electrode 45 may be formed as a common electrode by depositing on the entire surface of the first substrate 10. In the case of the organic light-emitting display device 1 according to the current embodiment, the pixel electrode 43 is used as an anode electrode, and the opposite electrode 45 is used as a cathode electrode. Of course the polarities of the pixel electrode 43 and the opposite electrode 45 may be reversed.

In the case where the organic light-emitting display device 1 is a bottom emission type in which an image is realized in a direction toward the first substrate 10, the pixel electrode 43 is a transparent electrode and the opposite electrode 45 is a reflective electrode. At this point, the reflective electrode may be formed so as to be thin by depositing a metal having a low work function, for example, Ag, Mg, Al, Pt, Pd, Au, Ni, Nd, Ir, Cr, Li, Ca, LiF/Ca, LiF/Al, or a compound of these metals.

According to the organic light-emitting display device 1 and a method of manufacturing the organic light-emitting display device 1 according to the current embodiment, the organic light-emitting display device 1 may be manufactured only through five mask processes. Therefore, in accordance with the reduction in the number of masks, manufacturing cost may be reduced and the manufacturing process may be simplified. Also, because the pixel electrode functions as a metal mirror by including nano-Ag, the formation of an additional layer which functions as the metal mirror is unnecessary. In addition, because a nano-Ag-transparent electrode (ITO) pad is formed in a pad area, a metal such as nano-Ag is not exposed, thereby preventing corrosion of the pad area.

When mask processes are performed for forming the organic light-emitting display device 1 described above, the removal of stacked films may be performed by dry or wet etching.

In the embodiment described above, the organic light-emitting display device 1 is described as an example. However, the present invention is not limited thereto, that is, various display devices including a liquid crystal display device may be used.

Also, in the drawings provided to explain the embodiment according to the current invention, a single TFT and a single capacitor are depicted for convenience of explanation. However, the present invention is not limited thereto, that is, a plurality of TFTs and a plurality of capacitors may be included as long as the number of mask processes is not increased.

According to an embodiment of the present invention, the process for manufacturing the organic light-emitting display device is simplified, and damage of the pad electrode is minimized, thereby enhancing the reliability of the organic light-emitting display device.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light-emitting display device, comprising:
a thin-film transistor which comprises:
an active layer;
an insulating layer formed on the active layer;
a gate electrode formed on the insulating layer, the gate electrode including a first electrode formed on the insulating layer and a second electrode formed on the first electrode, the first electrode including nano-Ag particles and a transparent conductive material;
a source electrode connected to the active layer; and
a drain electrode connected to the active layer;
an organic light-emitting device which comprises:
a pixel electrode which is electrically connected to the thin-film transistor and is formed at a same layer as the first electrode, a material of the pixel electrode being the same as a material of the first electrode;
an intermediate layer which includes an emissive layer; and
an opposite electrode which covers the intermediate layer and faces the pixel electrode; and
a pad electrode formed on an edge region of the organic light-emitting display device, the pad electrode formed at the same layer as the first electrode, a material of the pad electrode being the same as the material of the first electrode.

2. The organic light-emitting display device of claim 1, further comprising a capacitor which includes a lower electrode, which is formed of a semiconductor material doped with a dopant, and an upper electrode which is formed of the same layer as the first electrode using the same material used to form the first electrode.

3. The organic light-emitting display device of claim 2, wherein the upper electrode of the capacitor includes a nano-Ag thin-film having pores that are filled with a transparent conductive material.

4. The organic light-emitting display device of claim 2, wherein the upper electrode of the capacitor comprises a nano-Ag thin-film, which includes nano-Ag and is formed on the insulating layer, and a conductive layer, which is formed of a transparent conductive material and is formed on the nano-Ag thin-film.

5. The organic light-emitting display device of claim 1, wherein each of the first electrode of the gate electrode of the thin-film transistor, the pixel electrode of the organic light-emitting device, and the pad electrode includes a nano-Ag thin-film having pores that are filled with a transparent conductive material.

6. The organic light-emitting display device of claim 1, wherein each of the first electrode of the gate electrode of the thin-film transistor, the pixel electrode of the organic light-emitting device, and the pad electrode comprises a nano-Ag thin-film, which includes nano-Ag and is formed on the insulating layer, and a conductive layer, which is formed of a transparent conductive material and is formed on the nano-Ag thin-film.

7. The organic light-emitting display device of claim 1, wherein the second electrode is formed as a multiple layer.

8. The organic light-emitting display device of claim 1, wherein the pixel electrode is electrically connected to one of the source electrode and the drain electrode through an electrode layer formed of the same layer as the second electrode using the same material used to form the second electrode.

9. The organic light-emitting display device of claim 1, wherein the pad electrode is electrically connected to a driver integrated circuit (IC) which supplies a current for driving the organic light-emitting display device.

10. A method of manufacturing an organic light-emitting display device, the method comprising steps of:
performing a first mask process for forming an active layer of a thin-film transistor and a lower electrode of a capacitor;
forming a first insulating layer and a nano-Ag thin-film including nano-Ag particles on the active layer and the lower electrode;
performing a second mask process for forming a gate electrode of the thin-film transistor, for forming a first electrode pattern to form a pixel electrode, for forming a second electrode pattern to form an upper electrode of the capacitor, and for forming a third electrode pattern to form a pad electrode in a pad area on the first insulating layer, the gate electrode including a first electrode formed on the first insulating layer and a second electrode formed on the first electrode, the first electrode including a transparent conductive material and the nano-Ag thin-film including the nano-Ag particles;

performing a third mask process for forming an interlayer insulating layer having openings which expose edges of the active layer, the first electrode pattern, the second electrode pattern, and the third electrode pattern;

performing a fourth mask process for forming a source electrode and a drain electrode, each of the source electrode and the drain electrode contacting the active layer, one of the source electrode and the drain electrode contacting the pixel electrode; and performing a fifth mask process for forming a pixel defining film which exposes the pixel electrode, the organic light-emitting display device comprising the thin-film transistor, the organic light-emitting device and the pad electrode formed on an edge region of the organic light-emitting display device, the thin-film transistor comprising the active layer, the first insulating layer formed on the active layer, the gate electrode formed on the first insulating layer, the source electrode connected to the active layer, and the drain electrode connected to the active layer, wherein the organic light-emitting device comprises the pixel electrode which is electrically connected to the thin-film transistor and is formed at a same layer as the first electrode, an intermediate layer which includes an emissive layer, and an opposite electrode which covers the intermediate layer and faces the pixel electrode, a material of the pixel electrode being the same as a material of the first electrode, the pad electrode formed at the same layer as the first electrode, a material of the pad electrode being the same as the material of the first electrode.

11. The method of claim 10, wherein the step of performing the first mask process comprises:
forming a semiconductor layer on a substrate; and
forming the active layer and the lower electrode of the capacitor by patterning the semiconductor layer.

12. The method of claim 10, wherein the step of forming the nano-Ag thin-film comprises:
forming an Ag thin-film on the first insulating layer; and
forming the nano-Ag thin-film by annealing the Ag thin-film.

13. The method of claim 10, wherein the step of performing the second mask process comprises:
sequentially forming a first conductive layer and a second conductive layer on the nano-Ag thin-film;
forming the first electrode by patterning the nano-Ag thin-film and the first conductive layer; and
forming the second electrode by patterning the second conductive layer.

14. The method of claim 13, wherein the first conductive layer is a conductive layer formed of the transparent conductive material and the first conductive layer fills pores of the nano-Ag thin-film.

15. The method of claim 13, wherein the second conductive layer is formed as a multiple layer.

16. The method of claim 13, wherein the step of performing the fourth mask process comprises:
forming a third conductive layer on the interlayer insulating layer; and
forming the source electrode and the drain electrode by patterning the third conductive layer.

17. The method of claim 10, further comprising doping said edges of the active layer after performing the second mask process.

18. The method of claim 10, wherein the performing of the third mask process comprises:
forming a second insulating layer on a substrate on which the gate electrode, the first electrode pattern, the second electrode pattern, and the third electrode pattern are formed; and
forming openings which expose said edges of the active layer by patterning the second insulating layer and the first insulating layer, and forming openings which expose the first electrode pattern, the second electrode pattern, and the third electrode pattern by patterning the second insulating layer.

19. The method of claim 18, further comprising doping the lower electrode of the capacitor after performing the fourth mask process.

20. The method of claim 10, wherein the step of performing the fifth mask process comprises:
forming a third insulating layer on an entire surface of a substrate; and
forming a pixel defining layer by patterning the third insulating layer.

* * * * *